United States Patent [19]

Naito et al.

[11] Patent Number: 5,428,251
[45] Date of Patent: Jun. 27, 1995

[54] MULTI-LAYER WIRING STRUCTURE HAVING CONTINUOUS GRAIN BOUNDARIES

[75] Inventors: Masaru Naito; Takahisa Yamaha, both of Hamamatsu, Japan

[73] Assignee: Yamaha Corporation, Hamamatsu, Japan

[21] Appl. No.: 227,685

[22] Filed: Apr. 14, 1994

Related U.S. Application Data

[63] Continuation of Ser. No. 862,338, Apr. 2, 1992, abandoned.

[30] Foreign Application Priority Data

Apr. 5, 1991 [JP] Japan .................................. 3-100333

[51] Int. Cl.$^6$ .................. H01L 23/532; H01L 29/417
[52] U.S. Cl. ...................................... 257/765; 257/767
[58] Field of Search ............... 257/751, 758, 767, 771, 257/765; 437/194

[56] References Cited

U.S. PATENT DOCUMENTS

| H274 | 5/1987 | Ruggerio | 257/774 |
|---|---|---|---|
| 4,206,472 | 6/1980 | Chu et al. | 257/765 |
| 4,924,295 | 5/1990 | Küecher | 257/750 |
| 4,937,652 | 6/1990 | Okumura et al. | 257/765 |
| 4,976,809 | 12/1990 | Broadbent | 257/771 |
| 4,989,064 | 1/1991 | Kubokoya et al. | 257/771 |
| 5,018,001 | 5/1991 | Kondo et al. | 257/771 |
| 5,184,205 | 2/1993 | Shibata | 257/765 |
| 5,187,561 | 2/1993 | Hasunuma et al. | 257/771 |

FOREIGN PATENT DOCUMENTS

| 0137230 | 5/1990 | Japan | 257/765 |
|---|---|---|---|
| 0267940 | 11/1990 | Japan | 257/765 |
| 0157764 | 5/1992 | Japan | 257/765 |

OTHER PUBLICATIONS

Yamaha, Takahisa, et al., "Three Kinds of Via Electromigration Failure Mode in Multilevel Interconnections", Institute of Electrical and Electronics Engineers, Inc., San Diego, Calif., Mar.-Apr., 1992, pp. 349-355.

Yamaha, Masahisa, et al., The Institute of Electronics, Information and Communication Engineers, Technical Report vol. 91, No. 332, (1991) pp. 43-48.

Thin Film Handbook, p. 179, edited by Japan Gakujutu Shinkokai.

U.S. Patent Application Serial No. 08/036,940, filed Mar. 25, 1993, entitled "Semiconductor IC With Multi-layered AL Wiring," which lists Takahisa Yamaha and Masaru Naito as inventors.

Howard, J. K., et al., "Fabrication of Intermetallic Diffusion Barriers for Electromigration in Narrow-Line Stripes", IBM Technical Disclosure Bulletin, vol. 20, No. 9, Feb. 1978, p. 347.

*Primary Examiner*—Rolf Hille
*Assistant Examiner*—Peter Toby Brown
*Attorney, Agent, or Firm*—Spensley Horn Jubas & Lubitz

[57] ABSTRACT

In a multi-layer wiring structure of an integrated circuit device, occurrence of voids due to electromigration in the vicinity of an interface between upper and lower wiring layers is suppressed. The interface is cleaned in vacuum and grain size of the wiring layers is controlled. After an interlayer insulating film (16) having a connection hole (16A) is formed to cover a first wiring layer (14) of Al or an Al alloy, a second wiring layer (18) of Al or an Al alloy is formed and connected to the first wiring layer through the connection hole. When the second wiring layer is formed, grains ($G_2$) of the second wiring layer are formed so as to be respectively continuously adjacent to and substantially equal in size to grains ($G_1$) of the first wiring layer which appear at the interface. This control may be done by suitably controlling the condition of sputter-etching the surface of the first wiring layer through the connection hole and the condition of sputtering the Al or Al alloy of tile second wiring layer.

10 Claims, 5 Drawing Sheets

MULTI-LAYER WIRING STRUCTURE HAVING CONTINUOUS GRAIN BOUNDARIES

This is a continuation of application Ser. No. 07/862,338, filed Apr. 2, 1992, now abandoned.

BACKGROUND OF THE INVENTION

1. Field of the Invention

The present invention relates to an integrated circuit device, and particularly relates to an integrated circuit device having a multi-layer wiring structure made of Al or an Al alloy.

2. Description of the Related Art

In a conventional integrated circuit device such as an LSI, a two-layer wiring structure as shown in FIG. 4 has been adopted.

In FIG. 4, a first wiring layer 14 consisting of Al or an Al alloy is formed over the surface of a semiconductor substrate 10 of silicon or the like on an underlying insulating film 12 of silicon oxide or the like. On the insulating film 12, an interlayer insulating film 16 of PSG (phospho-silicate glass) or the like is formed on the upper surface of the insulating film 12 so as to overlie the wiring layer 14. A connecting hole 16A corresponding to a portion of the wiring layer 14 is formed in the insulating film 16. A second wiring layer 18 of Al or an Al alloy is formed on the upper surface of the insulating film 16 so as to be connected to the wiring layer 14 through the connection hole 16A. In FIG. 4, the symbol G represents a grain, the symbol GB represents a grain boundary, and the line S—S' represents the interface between the first and second wiring layers 14 and 18.

According to the above-mentioned conventional wiring structure, there has been a ease where voids occur in the interface between the wiring layers 14 and 18, which corresponds to the line S—S'.

Further, it is known that Al atoms are made to electromigrate by electrons if a current, of which current density is beyond $10^5$ A/cm$^2$, is supplied to an Al wire.

SUMMARY OF THE INVENTION

It: is an object of the present invention to provide an integrated circuit device having a novel multi-layer wiring structure in which the occurrence of voids can be suppressed.

According to an aspect of the present invention, there is provided an integrated circuit device which comprises: a semiconductor substrate; an underlying insulating film overlying a surface of the semiconductor substrate; a first wiring layer of Al or an Al alloy formed on the underlying insulating film; an interlayer insulating film formed on the first wiring layer and the insulating film, the interlayer insulating film having a connection hole corresponding to a portion of the first wiring layer; a second wiring layer of Al or an Al alloy formed on the interlayer insulating film so as to be connected to the first wiring layer through the connection hole; and grains of the first and second wiring layers being formed so that in the vicinity of the interface between the first and second wiring layers, the grain boundaries of the first and second wiring layers are substantially continuous across the interface. In addition, in the vicinity of the interface, the size of the grains of the first wiring layer is substantially equal to the size of the grains of the second wiring layer.

Since, in the vicinity of the interface between the first and second wiring layers, the grains of the second wiring layer which appear at the interface are formed so as to be respectively continuously adjacent to and substantially equal in size to the grains of the first wiring layer which appear at the interface, the respective grains of the first and second wiring layers continue to each other on the interface therebetween so that triple contact points are prevented from occurring. It is therefore possible to suppress the occurrence of voids due to electromigration. It is therefore possible to realize a highly reliable multi-layer wiring structure.

According to another aspect of the present invention, there is provided a method of manufacturing an integrated circuit device, which comprises the steps of: forming a first wiring layer of Al or an Al alloy, at a first substrate temperature, on a semiconductor substrate coated with an insulating film; patterning the first wiring layer; forming an interlayer insulating Film on the first wiring layer so as to cover the first wiring layer, the interlayer insulating film having a through connection hole formed to face part of a surface of the first wiring layer; lightly etching the part of the surface of the first wiring layer through the connection hole in an evacuated atmosphere; sputtering a second wiring layer of Al or an Al alloy, at a second substrate temperature, on the interlayer insulating film without breaking an evacuated atmosphere; and patterning the second wiring layer.

Preferably, the etching may be performed by sputtering with an inert gas before the growth of the second wiring layer of Al or Al alloy, so that an oxide film or the like formed non-intentionally on the surface of the first wiring layer of Al or Al alloy can be physically removed.

The growth of the second wiring layer of Al or Al alloy has a tendency to conform to the texture of the first wiring layer Al or an Al alloy which becomes the underlying layer, so that grain boundaries are apt to be produced in the portion where grain boundaries are exposed at the interface.

Grain size is influenced also by growth temperature. Under a clean vacuum, there is a tendency for grain size to become small at a low temperature, while it becomes large at high temperatures.

By suitably selecting the growth temperature at the time of growing the second wiring layer of Al or Al alloy on the first wiring layer of Al or Al alloy, the grain size of the wiring layer of Al or Al alloy can be adjusted to be substantially the same as the grain size of the first layer of Al or Al alloy in the vicinity of the interface. Then, the shape and position of the grain boundaries of the second wiring layer of Al or Al alloy can be easily made to conform with those of the grain boundaries of the first wiring layer of Al or Al alloy in such a multi-layer wiring structure made of Al or Al alloy, local current concentration hardly occurs and therefore voids hardly occur in the vicinity of the interface.

DETAILED DESCRIPTION OF THE PREFERRED EMBODIMENTS

First, description will be made about a phenomenon of occurrence of local concentration in current distribution due to discontinuity of grains.

Figure 5:
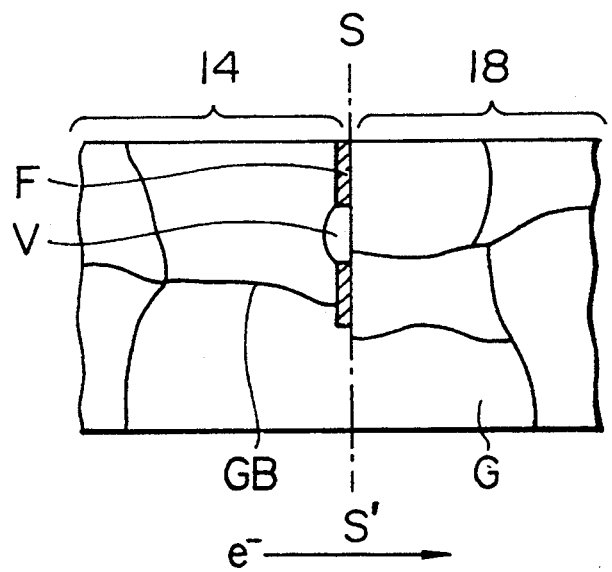
FIGS. 5 and 6 are cross-sections of examples of conventional wiring connection portions showing different states of growth of grains.

FIG. 5 shows an example where discontinuity of grains occurs. In this example, grains of a wiring layer 18 are grown while a thin insulating film F having a hole exists partially on the surface of a wiring layer 14. The intervention of a foreign material naturally causes the grains to be discontinuous in the vicinity of the interface. If a current ($e^-$) is caused to flow into such the wiring connection portion, a current path is limited by the insulating film F so that current density increases locally surrounding the film F. In a current concentration portion, electromigration makes the quantity of Al atoms flowing out to the side of the wiring layer 18 larger than the quantity of Al atoms supplied from the wiring layer 14. As a result, a void V is produced.

Figure 6:
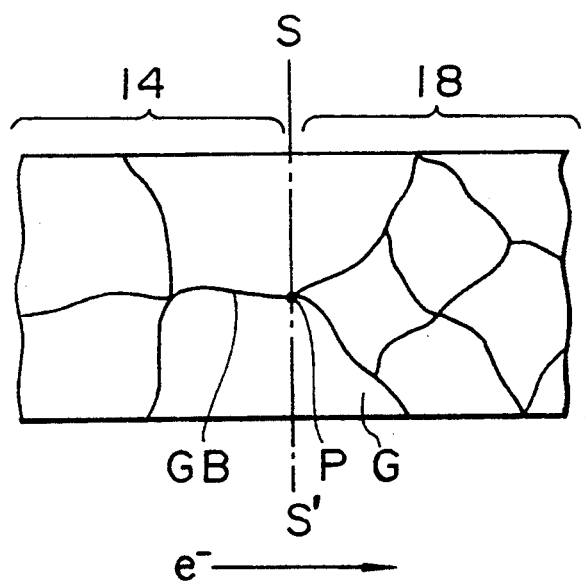

FIG. 6 shows another example where a void is generated by electromigration even if the grains are continuous at the interface. Although grains are continuous in the interface between the wiring layers 14 and 18, corresponding to the line S—S', grain size in the wiring layer 18 is smaller than that in the wiring layer 14, so that a triple contact point P is produced, in which two grain boundaries are produced on the wiring layer 18 side at one grain boundary on the wiring layer 14 side. The mechanism of void production is explained hereunder.

Electrons in the wiring move through a path in which an energy necessary to move between predetermined points is minimum. Therefore, electrons flow straightforward in the wiring. Accordingly, current density is equal at the grain boundary and in the grain.

Figure 7:
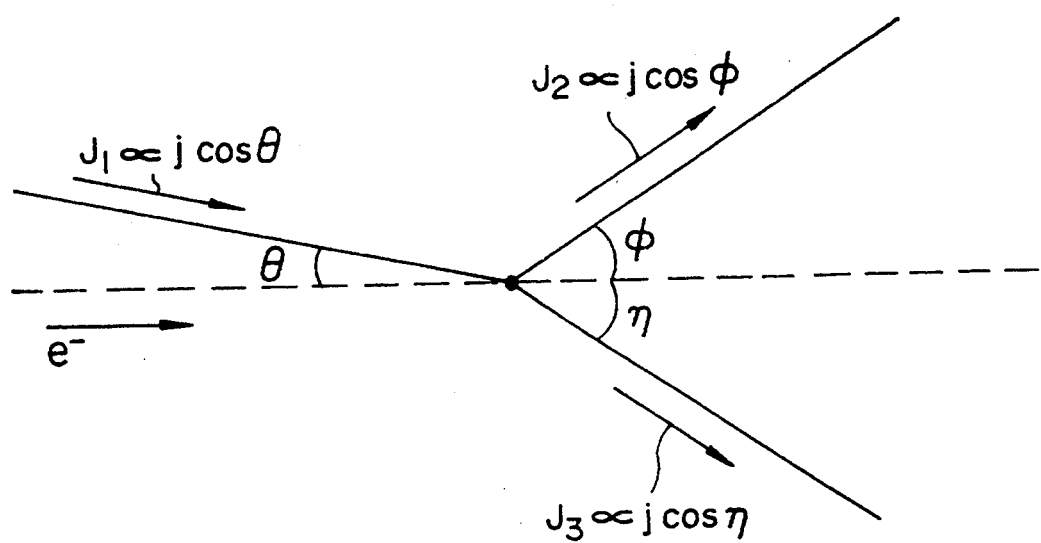
FIG. 7 is a schematic cross-section illustrating current flow at a triple contact point.

When current density is equal at the grain boundary and in the grain, an electromigration phenomenon often occurs at the grain boundary. Because a binding energy of aluminum to the grain boundary is less than a binding energy of aluminum to the grain, the aluminum atoms move easily at the grain boundary. The aluminum atom are displaced proportionally to the current density. Accordingly, the displacement of the aluminum atom reflects cosine element of the current density such as in FIG. 7. In FIG. 7, J1, J2 and J3 denote displacement of the aluminum atoms. Here, the symbol J denotes current density. When J1 is less than the sum of J2 and J3, the amount of aluminum atoms flowing from the triple contact point P is larger than the amount of aluminum atoms flowing into the triple contact point P. Therefore, the void is generated.

As has been described above, if a foreign material intervenes in the interface where Al or A]alloy wiring layers are connected to each other, or if average grain size is different in the opposing sides of the interface, a void is apt to be produced.

Figure 1:
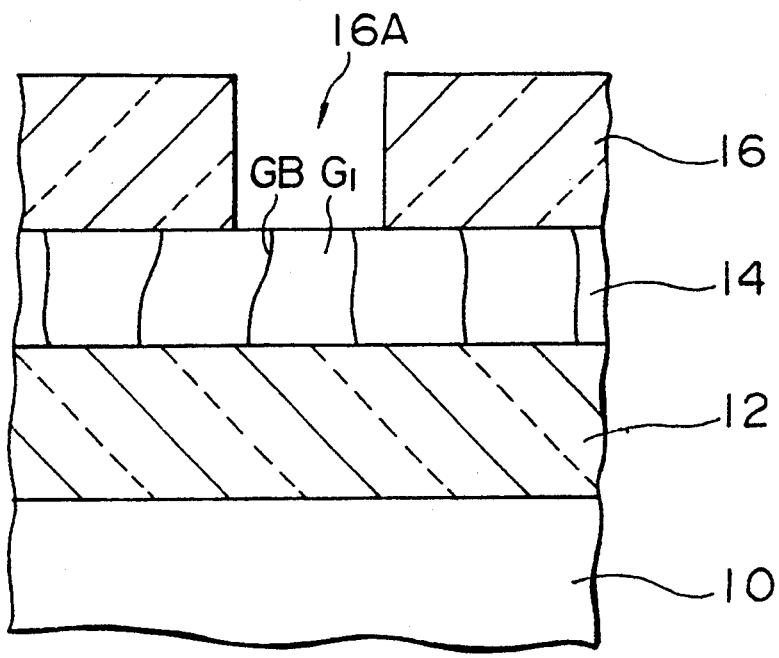
FIGS. 1 and 2 are cross-sections of a substrate illustrating a wiring forming method according to an embodiment of the present invention.
Figure 2:
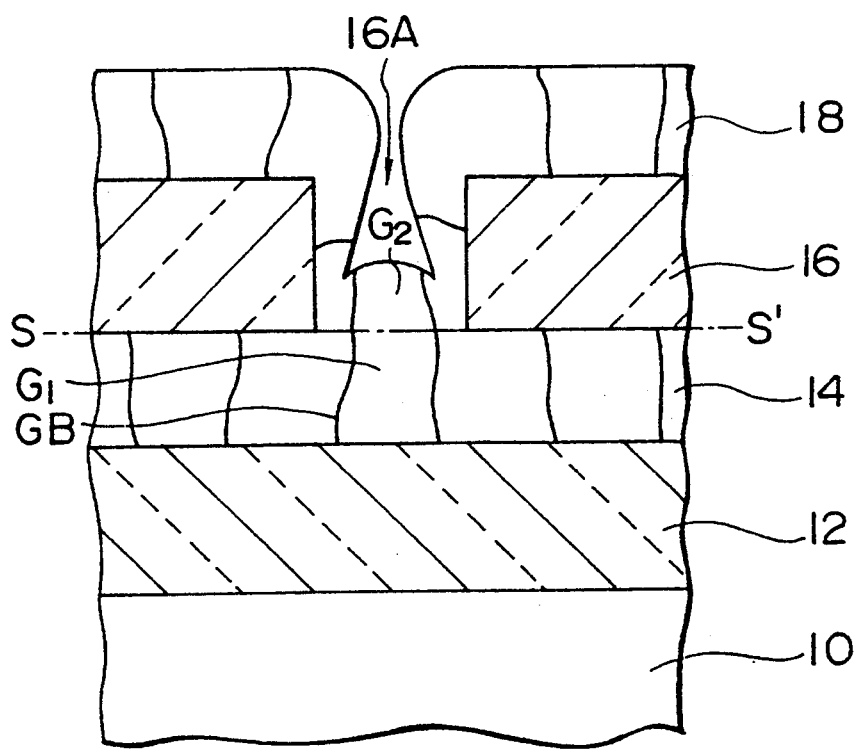
Figure 3:
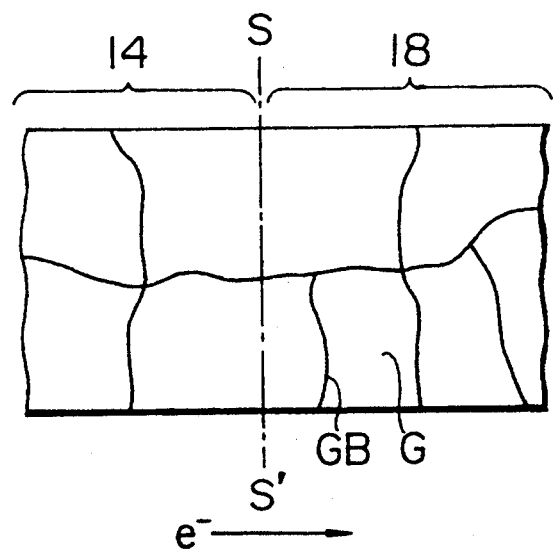
FIG. 3 is a cross-section of a wiring connection portion showing a state of growth of grains.
Figure 4:
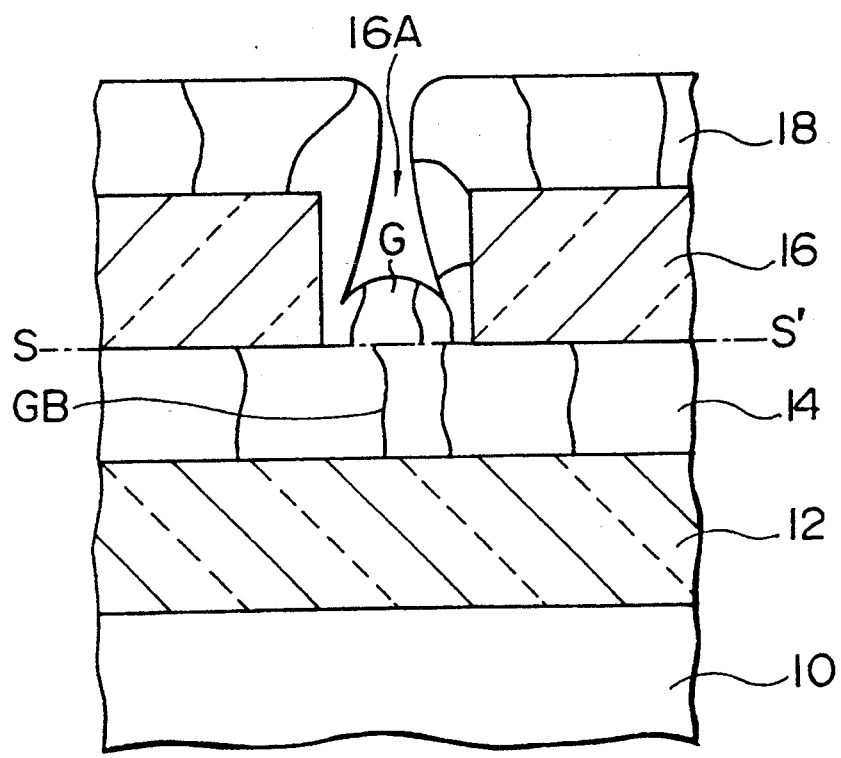
FIG. 4 is a cross-section of a substrate illustrating a conventional wiring structure.

FIGS. 1 and 2 show a method of forming an Al/Al-alloy multi-layer wiring structure according to an embodiment of the present invention. The steps (1) and (2) respectively corresponding to FIGS. 1 and 2 will be described sequentially.

Step (1): As shown in FIG. 1, an underlying insulating film 12 of silicon oxide or the like is formed on the surface of a substrate 10 made of a semiconductor such as silicon, and Al or an Al alloy is deposited, for example, by sputtering, so as to overlie the insulating film 12.

Figure 8:
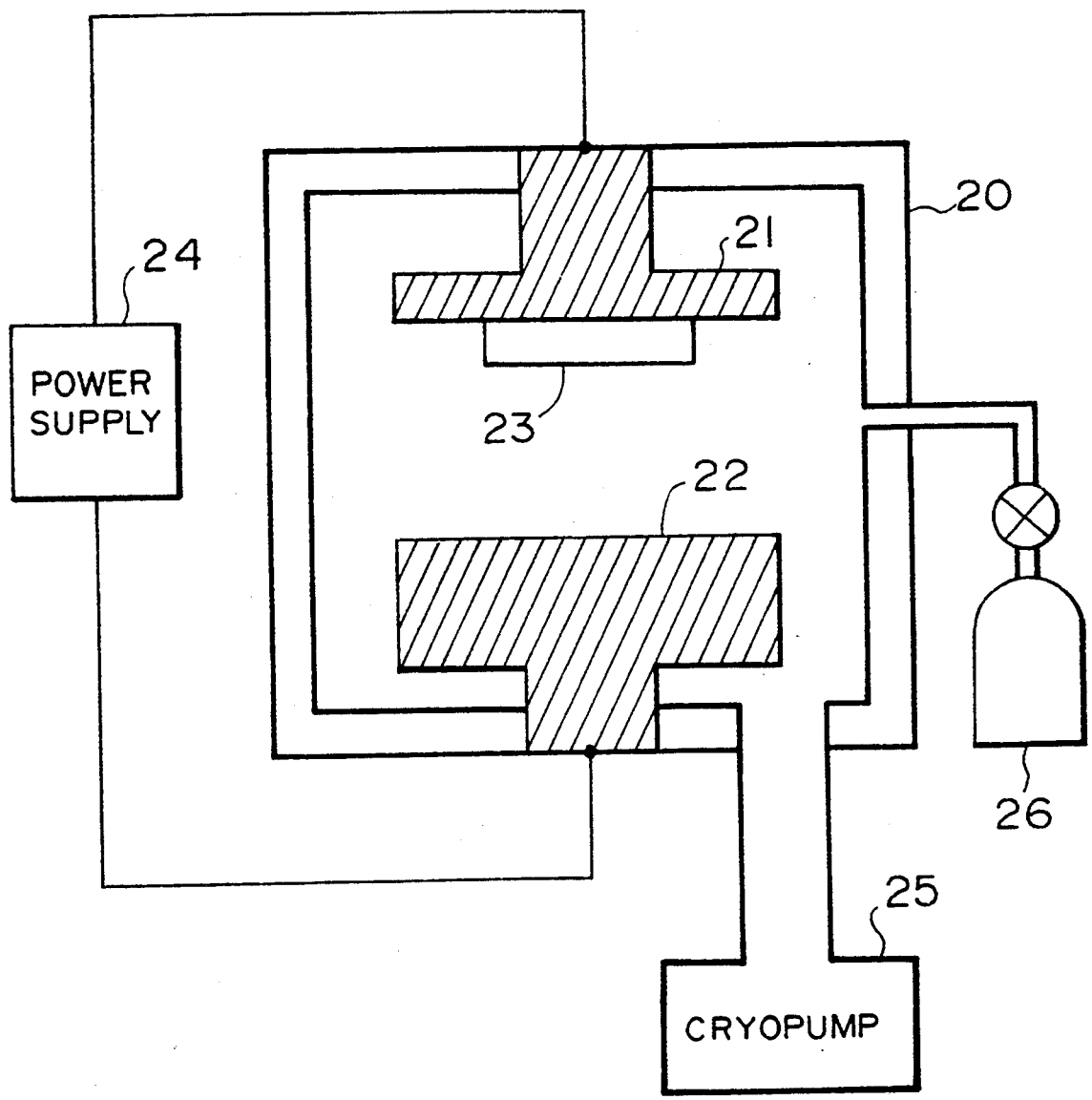
FIG. 8 is a schematic cross-section of a sputtering apparatus.

A sputtering apparatus of the preferred embodiment is shown in FIG. 8. In a bell jar 20, an upper electrode 21 and a lower electrode 22 are oppositely placed. The bell jar 20 is pumped by a cryopump 25. After pumping air from the bell jar 20, Ar gas is introduced into the bell jar 20. A DC voltage is applied by a power supply 24.

The aforementioned wiring layer 14 is deposited tinder the following conditions:
Substrate temperature: 120°–150° C.
Ar gas pressure: 8 mTorr
Applied power: 12–16 kW.

The aforementioned wiring layer 18 is deposited under the following conditions:
Substrate temperature: 200°–300 ° C.
Ar gas pressure: 8 mTorr
Applied power: 12–16 kW.

A first wiring layer 14 is formed by patterning tile deposited Al or Al alloy layer by well-known photolithographic treatment. An interlayer insulating film 16 of phospho-silicate glass or the like is formed to overlie the wiring layer 14 by CVD (chemical vapor deposition), etc. After that, a connection hole 16A is formed through the insulating film 16 by photolithographic treatment.

Step (2): Next, on the insulating film 16, a second wiring layer 18 of Al or an Al alloy is formed so as to be connected to the wiring layer 14 through the connection hole 16A. In this case, in the vicinity of the interface between the wiring layers 14 and 18, corresponding to the line S—S', grains $G_2$ of the wiring layer 18 are grown to be substantially equal in size to the grains $G_1$ of the first wiring layer 14. Also, the grain boundaries of the first and second wiring layers are substantially continuous across the interface. For achieving such a state, for example, the following treatment may be performed.

Before the Al or Al alloy for forming the wiring layer 18 is deposited by sputtering, part of the surface of the wiring layer 14 exposed in the connection hole 16A is etched by sputtering with Ar gas. Even if such an insulating film as shown in FIG. 5 is Formed in advance, the insulating film is removed by the sputtering with Ar gas.

The etching by Ar sputtering is performed by DC glow discharge under the following conditions:
Substrate temperature: room temperature
Gas pressure: 25 mTorr
Applied voltage: 500–600 V
Applied power: 430 W.

Thus, the surface of the wiring layer 14 is cleared. At this time, the exposed surface of the wiring layer 14 of Al or Al alloy is also etched lightly by this cleaning.

Next, Al or an Al alloy is sputtered in the same sputtering chamber as used for Ar gas sputtering, while the substrate is kept at a selected temperature. In such a manner, a layer of Al or an Al alloy is deposited on the insulating Film 16 so as to overlie the wiring layer 14 in the connection hole 16A. After that, the layer of Al or Al alloy is patterned to form the wiring layer 18.

In the above-mentioned etching by sputtering with Ar gas, not only contamination at the interface can be removed but the interlayer insulating film 16, etc. are sputtered at the same time. If sputtering is performed excessively, substances sputtered from the interlayer insulating film 16, etc. may adhere to the exposed surface again to cause contamination. Therefore, preferably, the treatment conditions such as treatment time and so on are optimized so that no contamination is introduced into the connect ion hole 16A.

To perform a test for electromigration withstanding property, samples of wiring connection portions, such as shown in FIG. 2, were formed under the sputtering treatment time of 30, 60 and 90 seconds.

This sputtering was done under the following conditions. The sputtering time corresponds to an etched thickness of thermal oxidation film. Each of the sputtering treatment time of 30, 60 and 90 seconds respectively correspond to 10, 20 and 30 nm of the etched thickness of the thermal oxidation film.

The test for electromigration withstanding property on the prepared samples were carried out under the following conditions:

Temperature: 190° C.
Current density: $2.0 \times 10^6$ A/cm$^2$
Area of connection hole: 1.0 μm$^2$
Numbers of the connection holes: 2800.
The 50% merged time of fault (MTF) was as follows.

| Treatment Time | MTF |
| --- | --- |
| 30 seconds | 360 hours |
| 60 seconds | 1,300 hours |
| 90 seconds | 660 hours |
| 120 seconds | 520 hours |

As a result, it was found that superior electromigration withstanding property can be obtained by sputter-etching with Ar gas for 45 to 75 seconds, which corresponds to 15–25 nm thickness of thermal oxidation film sputtering or a treatment time of about 60 seconds.

In sputtering Al or Al alloy in preparation for forming the wiring layer 18, preferably the process conditions, particularly the substrate temperature are optimized so that the size of grains becomes uniform on the upper and lower sides of the interface.

For example, if the wiring layer 14 is formed at the substrate temperature 150° C., the wiring layer 18 is formed at about the substrate temperature 300° C.

Although the case of performing sputtering with Ar gas has been described another gas may be used provided that it does not give a bad influence to a semiconductor device. For example, another inert gas such as He, Kr, etc. may be used.

Further, an insulating film on an underlying wiring layer may be etched off in the same apparatus by use of slight selective dry etching.

The above-mentioned method is not limited to such a two-layer wiring structure as shown in the above-mentioned embodiment, but can also be applied to a wiring structure of three or more layers.

Although the present invention has been described along its embodiment, the present invention is not limited to this embodiment. It will be obvious to those skilled in the art that various changes, modifications, combinations and so on can be made thereto.

What is claimed is:

1. An integrated circuit device comprising:
    a semiconductor substrate;
    a first insulating film overlying at least a portion of said semiconductor substrate;
    a first wiring layer of Al or an Al alloy overlying said first insulating film, said first wiring layer having grains of an average size and grain boundaries;
    a second insulating film formed on said first wiring layer, said second insulating film having a connection hole formed therein and wherein said first wiring ,layer has a cleaned surface within said connection hole; and
    a second wiring layer of Al or an Al alloy formed on said second insulating film and in at least a portion of said connection hole to connect with said first wiring layer at said cleaned surface as an interface, said second wiring layer having grains of an average size and grain boundaries, the average size of the grains of the first wiring layer and the average size of the grains of the second wiring layer being the same in the vicinity of said interface, and the grain boundaries of the first and second wiring layers being continuous across said interface.

2. An integrated circuit device according to claim 1, wherein said first wiring layer has a surface indentation within said connection hole.

3. An integrated circuit device according to claim 1, wherein said cleaned surface has been sputter etched to remove a natural oxide or contaminants from the surface of the first wiring layer.

4. An integrated circuit device according to claim 1, wherein grains of said first wiring layer at said interface have identical cross sectional shapes and areas in the plane of said interface to corresponding grains of said second wiring layer at said interface.

5. An integrated circuit device according to claim 1, wherein grain boundaries of the first wiring layer at said interface are each characterized by a first set of grain boundary directions extending toward the interface and the grain boundaries of the second wiring layer at said interface are each characterized by a second set of grain boundary directions extending away from said interface, wherein the first set of grain boundary directions and the second set of grain boundary directions are the same along each of the grain boundaries at said interface.

6. An integrated circuit device comprising:
    a semiconductor substrate;
    a first insulating film overlying at least a portion of said semiconductor substrate;
    a first metal wiring layer of Al or Al alloy overlying said first insulating film, said first metal wiring layer having grains of an average size and grain boundaries;
    a second insulating film formed on said first metal wiring layer, said second insulating film having a plurality of connection holes formed therein, wherein said first metal wiring layer has a cleaned surface within each of said plurality of connection holes; and
    a second metal wiring layer of Al or Al alloy formed on said second insulating film and in at least a portion of each of said connection holes to connect with said first metal wiring layer, wherein each of said cleaned surfaces of said first wiring layer is an interface between said first metal wiring layer and said second metal wiring layer within said plurality of connection holes, said second metal wiring layer having grains of an average size and grain boundaries, the average size of the grains of the first metal wiring layer and the average size of the grains of the second metal wiring layer being the same in the vicinity of said interface, and the grain boundaries of the first and second metal wiring layers being continuous across said interface.

7. An integrated circuit device according to claim 6, wherein said first metal wiring layer has a surface indentation within each of said plurality of connection holes.

8. An integrated circuit device according to claim 6, wherein said cleaned surfaces have been sputter etched to remove a natural oxide or contaminants from the surface of the first wiring layer.

9. An integrated circuit device according to claim 6, wherein grains of said first wiring layer at each of said interfaces have identical cross sectional shapes and areas in the plane of said each of said interfaces to corresponding grains of said second wiring layer at said each of said interfaces.

10. An integrated circuit device according to claim 6, wherein grain boundaries of the first wiring layer at each of said interfaces are each characterized by a first set of grain boundary directions extending toward said each of said interfaces and the grain boundaries of the second wiring layer at said each of said interfaces are each characterized by a second set of grain boundary directions extending away from said each of said interfaces, wherein the first set of grain boundary directions and the second set of grain boundary directions are the same along each of the grain boundaries at said each of said interfaces.

* * * * *